United States Patent
Leisen et al.

(10) Patent No.: US 12,289,937 B2
(45) Date of Patent: Apr. 29, 2025

(54) CONTROLLED WETTING IN THE MANUFACTURE OF ELECTRONIC COMPONENTS

(71) Applicant: OSRAM Opto Semiconductors GmbH, Regensburg (DE)

(72) Inventors: Daniel Leisen, Regensburg (DE); Simon Jerebic, Donaustauf (DE); Max Wenzel, Altdorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 465 days.

(21) Appl. No.: 17/432,908

(22) PCT Filed: Feb. 25, 2020

(86) PCT No.: PCT/EP2020/054845
§ 371 (c)(1),
(2) Date: Aug. 20, 2021

(87) PCT Pub. No.: WO2020/173908
PCT Pub. Date: Sep. 3, 2020

(65) Prior Publication Data
US 2022/0077357 A1     Mar. 10, 2022

(30) Foreign Application Priority Data
Feb. 25, 2019  (DE) .......................... 102019104695.5

(51) Int. Cl.
*H10H 20/853*     (2025.01)
*H10H 20/01*      (2025.01)
(Continued)

(52) U.S. Cl.
CPC ....... *H10H 20/853* (2025.01); *H10H 20/0362* (2025.01); *H10H 20/0364* (2025.01);
(Continued)

(58) Field of Classification Search
CPC ......... H01L 33/54; H01L 33/56; H01L 33/62; H01L 2933/005; H01L 2933/0066;
(Continued)

(56) References Cited

U.S. PATENT DOCUMENTS 6,577,012 B1 * 6/2003 Greenwood ............ H01L 24/81
257/E21.511
8,575,646 B1   11/2013 Shum
(Continued)

FOREIGN PATENT DOCUMENTS

DE     102010024864 A1   12/2011
KR     20080029279 A      4/2008
(Continued)

OTHER PUBLICATIONS

Hoheisel, et al. "Fabrication of adhesive lenses using free surface shaping" Journal of the European Optical Society—Rapid publications [Online], vol. 8 (Sep. 19, 2013). (Year: 2013).*
(Continued)

*Primary Examiner* — Benjamin P Sandvik
*Assistant Examiner* — John Patrick Cornely
(74) *Attorney, Agent, or Firm* — Slater Matsil, LLP

(57) ABSTRACT

In an embodiment a method for manufacturing at least one electronic component includes providing a second surface area of the component adjacent to a first surface area, wherein the second surface area is repulsive to a first fluid to be applied, applying the first fluid without additional pressurization to the first and/or second surface area, wherein the first surface area is wetted by the first fluid and the first fluid is repelled from the second surface area and applying a second fluid to the first surface area, to the second surface area and/or to a surface area of the solidified first fluid, after solidification of the first fluid applied to the first surface area, wherein applying the second fluid includes
(Continued)

applying a positive pressure, a plasma action and/or a compression molding, and wherein the second fluid wets the second surface area.

12 Claims, 5 Drawing Sheets

(51) Int. Cl.
 *H10H 20/80* (2025.01)
 *H10H 20/854* (2025.01)
 *H10H 20/857* (2025.01)

(52) U.S. Cl.
 CPC ......... *H10H 20/854* (2025.01); *H10H 20/857* (2025.01); *H10H 20/872* (2025.01)

(58) Field of Classification Search
 CPC ... H01L 2933/0083; H01L 2224/48225; H01L 33/486; H01L 33/52; H01L 33/0091
 See application file for complete search history.

(56) References Cited

U.S. PATENT DOCUMENTS

| | | | |
|---|---|---|---|
| 9,818,921 | B2 | 11/2017 | Ramchen et al. |
| 2008/0232420 | A1* | 9/2008 | Brunner ................. H01L 33/505 372/50.23 |
| 2013/0087822 | A1 | 4/2013 | Kim |
| 2013/0164869 | A1* | 6/2013 | Ebe ....................... C08K 5/5425 438/27 |
| 2018/0240942 | A1 | 8/2018 | Ootorii |

FOREIGN PATENT DOCUMENTS

| | | |
|---|---|---|
| WO | 2012041925 A1 | 4/2012 |
| WO | 2017142817 A1 | 8/2017 |

OTHER PUBLICATIONS

"Adjacent." Merriam-Webster.com Dictionary, Merriam-Webster, https://www.merriam-webster.com/dictionary/adjacent. Accessed Sep. 3, 2024. (Year: 2024).*

* cited by examiner

CONTROLLED WETTING IN THE MANUFACTURE OF ELECTRONIC COMPONENTS

This patent application is a national phase filing under section 371 of PCT/EP2020/054845, filed Feb. 25, 2020, which claims the priority of German patent application 102019104695.5, filed Feb. 25, 2019, each of which is incorporated herein by reference in its entirety.

TECHNICAL FIELD

The present invention relates to a method for manufacturing electronic components, in particular optoelectronic components, in particular LED packages, in particular with the steps of connecting and/or encapsulating elements of a component, by means of introducing liquid and/or pasty materials having low-viscosity components. The present invention also relates to correspondingly manufactured devices, in particular electronic components, in particular optoelectronic components, for example LED packages.

BACKGROUND

In the assembly of light emitting diode packages, liquid and/or paste-like materials with low-viscosity elements are used for bonding, in particular adhesive bonding, and/or encapsulation.

Uncontrolled and undesirable wetting of the inserted materials with, for example, a substrate or other components in the package may occur.

Conventionally, the amount of adhesive is adjusted to reduce lateral flash or sprouting or undesirable lateral penetration surfaces. The use of stop edges is also known. These can be created on an upper package wall, for example. With a suitable "core-pin" design, for example, an inner edge of a package can form a stop edge. Another possibility is the so-called thixotroping of the binding or encapsulating medium in order to adjust its flow behavior. In this way, the flow behavior of the material is specifically adapted. Outside the field of light-emitting diode production, so-called microstructuring DLIP is known to manufacture antibacterial surfaces with specifically poor wettability for aqueous media.

SUMMARY OF THE INVENTION

Embodiments provide a method for manufacturing electronic components, in particular optoelectronic components, LED packages or laser components, in such a way that uncontrolled and undesirable wetting of other elements of the component is avoided when processing elements of a component by introducing a metered amount of a fluid. In the case of liquid and/or pasty materials with low viscosity components, uncontrolled and undesirable wetting of a substrate and/or other elements of the component with the introduced materials may be avoided.

According to a first embodiment, a method for obtaining at least one electronic component, in particular an optoelectronic component, an LED package or a laser component, is proposed comprising the following steps: providing a second surface area of the component adjacent to a first surface area, the second surface area being created repulsive to a first fluid to be applied and applying the first fluid without additional pressurization to the first and/or second surface area, wherein the first surface area is wetted by the first fluid and the first flu-id is repelled from the second surface area.

According to a second embodiment, a device, in particular an electronic component, in particular an optoelectronic component, an LED package or a laser component, is proposed, wherein a second surface area of the component is formed adjacent to a first surface area, the second surface area being created to be repellent to a first fluid to be applied and wherein the first fluid has been applied to the first and/or second surface area without additional pressurization, wherein the first surface area is wetted by the first fluid and the second surface area is uncovered by the first fluid.

Wetting is a behavior of fluids in contact with the surface of solids. Wettability is the associated property of the solid surface. Depending on the fluid involved, the material of which the surface is made and its nature, for example in terms of roughness, the fluid will wet the surface to a greater or lesser extent.

A drop of fluid applied to a horizontal, flat surface illustrates the wettability and its subdivision. The wettability depends on the ratios of the surface tensions involved, which are related to the contact angle via Young's equation and thus make this the measure of wettability. The smaller the contact angle, the greater the wettability.

To assess whether a drop spreads on a surface, one compares the cohesive forces within the drop with the adhesive forces against the surface. If the adhesive forces far outweigh the cohesive forces, the drop will spread completely on the sur-face, it will wet it completely.

Wetting Types
No Wetting
The fluid on the surface contracts into an almost spherical drop (contact angle greater than 90°). If the surface is slightly inclined, the drop slides down without any fluid residue, in other words: the fluid beads off. In the ideal case, the contact angle is 180°. In this case, the fluid droplet only touches the solid at one point.
Partial Wetting
The fluid on the surface forms a round hood (contact angle less than 90°). With a medium inclination of the surface, the fluid glides down from the surface in a club shape. No or little fluid residue is observed.
Complete Wetting
The fluid spreads out on the surface in the form of a flat disk (macroscopic contact angle not present). Only when the surface is tilted more strongly does the fluid run down. In the process, the fluid disk stretches in length and forms a stripe in the direction of inclination. Fluid residues ad-here to the surface, even with the strongest inclination. Ideally, this is a monomolecular film and a contact angle of zero.

Leaves of plants in contact with water droplets show—de-pending on the type of leaf—one of the three cases of wet-ting described above. The lotus flower, for example, shows very little wetting, which is due to the lotus effect.

The lotus effect is the term used to describe the low wettability of a surface, as can be observed in the lotus plant. Water beads off in drops, taking with it all the dirt particles on the surface. Responsible for this is a complex micro- and/or nanoscopic architecture of the surface, which minimizes the adhesion of dirt particles.

Viscosity refers to the viscosity or toughness of fluids and gases (fluids). The greater the viscosity, the more viscous (less flowable) the fluid; the lower the viscosity, the more thin (more flowable) it is.

Low viscosity is, for example, water at 25° C. with 0.891 mPa s and at 5° C. with 1.52 mPa s. Medium viscosity is, for example, grape juice in the range from 2 to 5 mPa s. High viscosity is, for example, honey with approximately 10,000 mPa s.

Low viscosity here means, for example, having a viscosity <about 100 mPa s.

Adjacent means, in particular, that two surface areas along a surface have a common line of contact. A boundary region can act as a stop region for a first fluid.

Instead of the word "liquid", the term "fluid" is preferred here.

Raw chip is a semiconductor material separated from a wafer after fabrication, providing an unpackaged electronic component or integrated circuit. Since the semiconductor material is usually in the form of a die, the terms "dice" or "die" are used.

An approach for local control of wetting is proposed. For this purpose, individual surface areas are microstructured, for example by means of DLIP (Direct Laser Interference Patterning). In addition, a cancellation of a lotus blossom effect for a subsequent second material is proposed, whereby wetting can be forced under pressure.

By means of local periodic microstructuring, wetting behavior can be specifically influenced. Reference is made here in particular to the lotus blossom effect. For example, an ablative DLIP process can be used here.

A second material can be applied or applied under pressure in the areas previously set to have a dewetting effect.

Further embodiments are claimed in connection with the sub-claims.

According to one embodiment, an application of a second flu-id to the first surface area, to the second surface area, and/or to a surface area of the solidified first fluid may be performed after a solidification of the first fluid ap-plied to a first surface area.

According to one embodiment, the application of the second fluid, in particular to the second surface area, may be carried out by means of overpressure, plasma action and/or compression molding, in particular foil assisted compression molding, wherein the second fluid may wet the second surface area.

According to one embodiment, the provision of the first flu-id repelling second surface area can be performed by means of periodic micro- and/or nano-structuring of the second surface area, in particular by means of direct laser interference pattern generation (DLIP), wherein in particular a periodicity, in particular in the range of circa 600 nm to circa 1000 nm can be created.

According to one embodiment, providing the first fluid repelling second surface area may be performed using moth eye structures and/or the lotus effect and/or by means of the material or a coating of the second surface area.

According to one embodiment, the first fluid may be pasty and/or comprise at least one low viscosity component.

According to one embodiment, the first fluid may comprise an adhesive, in particular a layered adhesive, a solder and/or a potting compound, and in particular may be applied in a metered manner.

According to one embodiment, the second fluid may be equal to the first fluid.

According to one embodiment, attaching a raw chip, in particular a raw LED chip, to a substrate, in particular a substrate comprising silicone; applying a spray coating, in particular a phosphor spray coating, for example a phosphor spray coating, to the raw chip attached to the substrate and to the substrate on its side facing the raw chip; providing the spray-coated main surface of the raw chip facing away from the substrate as the second surface area, can be per-formed, wherein the remainder of the spray coating with its side facing away from the substrate being able to form the first surface area; further applying a first fluid providing a covering layer, in particular comprising titanium dioxide, to the first surface area, in particular by means of flushing or jetting, can be performed, wherein the first surface area is wetted and the second surface area remains unwetted.

According to one embodiment, an application of a second flu-id to the second surface area and to a surface area of the solidified first fluid, in particular by means of overpressure PÜ, may be carried out after a solidification of the first fluid applied to the first surface area.

According to one embodiment, attaching a raw chip, in particular LED raw chips, on a substrate; providing second sur-face areas on the substrate adjacent to a raw chip mounting surface and/or on a main surface of the raw chip facing away from the substrate can be performed, wherein the first sur-face area can be provided as the side surfaces and as the main surface of the raw chip facing away from the substrate; further, an application of a first fluid created as a layered adhesive can be carried out without applying additional pressure to the first surface areas, wherein the first sur-face areas are wetted and the second surface areas remain unwetted.

According to one embodiment, using the second surface area on the main surface of the raw chip facing away from the substrate under additional pressurization can be implemented as a contact area for wire bonding with a second fluid created as a solder for a wire connection.

According to one embodiment, a further second fluid, in particular comprising titanium dioxide and providing a covering layer, can be applied to the side of the raw chip, in particular by means of a film-assisted compression molding (FAM), with additional pressurization.

According to one embodiment, a silicone layer can be applied to a raw chip attached to a substrate on its main surface facing away from the substrate, wherein the surface of the silicone layer facing away from the substrate is provided as a second surface area and the side surface of the silicone layer, the side surface of the raw chip and the side of the substrate facing the raw chip are provided as a first sur-face area; moreover, the first fluid can be applied as an encapsulation, in particular comprising titanium dioxide, without applying additional pressure to the first surface area, the first surface area being wetted and the second surface area (2) remaining unwetted.

According to a further embodiment, a provision of a second surface area on the substrate adjacent to a raw chip mounting area, in particular as a wire bond area, can be carried out, with the remaining substrate on the side of the raw chip mounting area forming the first surface area; in addition, the first fluid, in particular in the form of a layered adhesive, can be applied to the first surface area without applying additional pressure, the first surface area being wetted and the second surface area remaining unwetted; in addition, a raw chip, in particular an LED raw chip, can be attached to the substrate on the first surface area at the raw chip mounting surface.

According to a further embodiment, wire bonding may be per-formed wherein the second fluid is an adhesive or solder that may be applied to the second surface area with additional pressurization.

According to a further embodiment, providing the second sur-face area may be performed at an exit side of a cavity housing.

According to a further embodiment, an electronic component arranged on a substrate, in particular a volume emitter, may be provided with first surface areas selected adjacent to the component on the side of the substrate facing the component and with second surface areas provided at a distance from the component on the side of the substrate facing the component, wherein an application of a first fluid created as a reflector material can be carried out without addition-al pressurization to the first surface areas, whereby these are wetted and the second surface areas remain unwetted.

According to a further embodiment, an application of the reflector material may be performed with a constant thickness between the volume emitter and the respective second surface areas.

According to a further embodiment, an application of a drop-let of a first fluid created as a lens material may be per-formed without additional pressurization to a circular shaped first surface area, wherein the first surface area is wetted and the outer edge region of the circle as the second surface area remains unwetted.

According to a further embodiment, providing a protective region, in particular for electrical contacts, may be implemented as a second surface area around which a first surface area is arranged and which remains unwetted by the first fluid.

According to a further embodiment, by reducing the wettability of a surface area, its tackiness can be reduced and dirt repellency can be provided.

According to a further embodiment, by increasing the wettability of a surface area, an adhesion improvement for material compositions, in particular to a substrate or to wire connections, can be provided.

According to a further embodiment, a device, in particular an electronic component, in particular an optoelectronic component, an LED package or a laser component, can be provided, which has been created according to one of the pre-ceding embodiments, in particular by means of the following steps, namely bonding and/or encapsulating at least one element of the component, by means of a fluid and/or a pasty material comprising at least one low viscosity component, wherein beforehand by means of a machining of a surface area formed by the component, the repellent effect of said sur-face area when exposed to the fluid or the pasty material has been determined, so that said surface area can act as a stop area against the fluid or the pasty material.

BRIEF DESCRIPTION OF THE DRAWINGS

The invention is described in more detail with reference to embodiments in conjunction with the figures.

DETAILED DESCRIPTION OF ILLUSTRATIVE EMBODIMENTS

Figure 1:
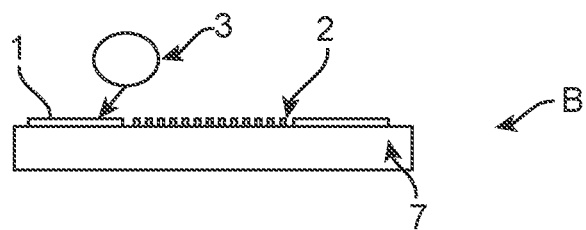
FIG. 1 shows a first illustration for surface design.

FIG. 1 shows an illustration of effective surface designs. Reference character 1 indicates a first surface area which can be wetted or covered by means of a first fluid 3. A second surface area 2 is also formed on a substrate 7, which is adjacent and contiguous to the first surface area. Both sur-face areas have a common contact line. All of the aforementioned elements are part of an electronic component B, in particular an optoelectronic component. The second surface area 2 can, for example, use a so-called "lotus blossom effect" for light emitting diode applications. This is based on complex micro- and/or nanostructured surface areas. Such a surface feature can be provided, for example, by means of a DLIP microstructuring process (DLIP=Direct Laser Interference Patterning). In this way, the second surface area 2 is formed as a microstructured area that uses the so-called lotus blossom effect in such a way that the second surface area 2 is a dewetting surface. The first surface area 1 and the second surface area 2 are formed on a substrate which in particular comprises silicone and/or in particular forms LED chip or substrate areas. FIG. 1 shows how a metered volume of liquid material as an embodiment of a first fluid 3 wets the first surface area 1 and does not wet the second surface area 2 due to its microstructured design. FIG. 1 shows a device that can be part of an LED package. The second sur-face area 2 has a structuring, and in particular in the sub-micrometer to micrometer range. Of importance is, for example, a correct aspect ratio.

In process engineering in particular, the aspect ratio is the ratio of the depth or height of a structure to its smallest lateral dimension. In general, the greater the aspect ratio and the smaller the absolute size of the structure, the more difficult it is to manufacture. The aspect ratio is particularly relevant in microtechnology. For example, a hole 60 millimeters deep can be drilled with a 6-mm drill. Thus, this hole has an aspect ratio of 10(:1). Such structuring can be manufactured by etching processes or anisotropic structuring processes, such as reactive ion etching. Furthermore, wet chemical etching processes can be used. This can be carried out in particular in conjunction with photolithography.

In this way, there are numerous parameters that must be taken into account to create an appropriately repellent surface texturing.

In addition, the material properties of surface areas and fluids are important. If, for example, the first fluid 3 is a silicone containing a phosphor, in particular phosphorus, it is possible to create a clear boundary region between the first surface area 1 and the second surface area 2. Thus, wetting in the second surface area 2 can be specifically prevented. For example, a silicone layer that is adhered tends to wet an adjacent second surface area 2. In particular, embodiments of the present invention relates to the wetting behavior in an edge region of the first surface area 1 to be wetted. A safer method in a global or larger area is to be provided more reliably. A so-called error path is to remain behind a clearly defined line. By an avoidance of undesired wetting, optical decoupling properties can be improved additionally. Specific suitable materials can result from a particular ap-plication.

Figure 2:
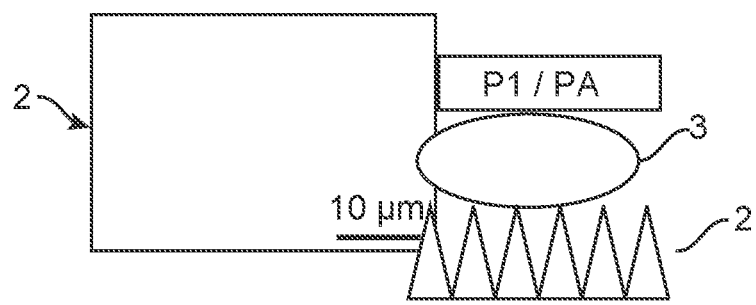
FIG. 2 shows a second illustration of acting surface designs.

FIG. 2 shows an illustration for an effective surface de-sign. Reference sign 2 designates a second surface area 2 which is not to be wetted by a first fluid 3, in particular without additional pressurization, i.e. generally in particular under atmospheric pressure PA/P1. FIG. 2 shows the targeted control of the wettability of polycarbonate substrates for a macromolecular nanotechnology as an example of a second surface area 2 by means of the production of hierarchical structures, in particular using so-called direct laser interference patterning.

Figure 3:
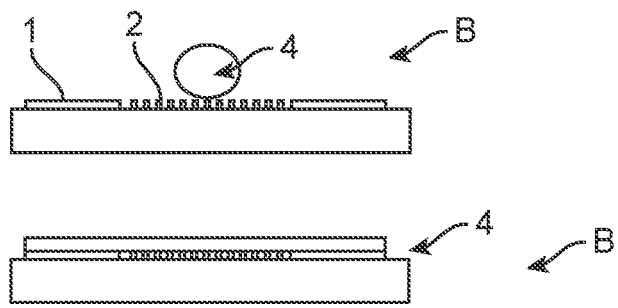
FIG. 3 shows a third illustration of proposed surface designs.
Figure 4:
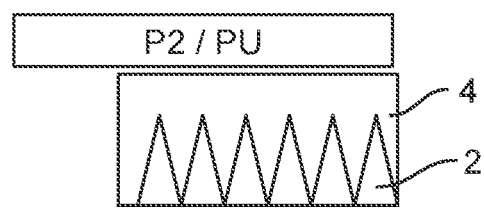
FIG. 4 shows an illustration of an effective cancellation of an unwettability.

FIG. 3 shows a further illustration of an effective de-vice. Reference character 1 indicates a first surface area which has been covered or wetted by the first fluid 3, for example. According to FIG. 3, a second fluid 4 is now ap-plied to the second surface area 2 under additional pressure. This can be the same optoelectronic component B as shown in FIG. 1. The lower illustration in FIG. 3 shows how the second fluid 4 covers both the first surface area 1 and the second surface area 2, and has solidified thereon. In this case, a high pressure P2/PÜ is to be applied with which the second fluid 4 is pressed into the second surface area 2. A mold press is particularly suitable for this purpose, in which, for example, 50 to 100 KN is applied to an area of approximately 4×4 square inches. This corresponds approximately to a pressure of, in particular, 4 MPa. The required pressure can also be provided for the application of a wirebond. The high pressure in FIG. 4 is marked P2/PÜ. One can see how the second fluid 4 has been pressed into the surface structure of the second surface area. A metered liquid material volume of a second fluid 4 is applied. With a suitable dosage, wetting of the first and second sur-face areas 1 and 2 can be supported in advance. In principle, the second fluid 4 can also be provided by the first fluid 3. Wetting takes place under high pressure, for example during compression molding, which results in subsequent good adhesion due to the mechanical anchoring in the micro-plane or on the microscale in the second surface area 2. In this way, a previous dewetting behavior can be reversed by means of liquid application under high pressure.

Figure 5:
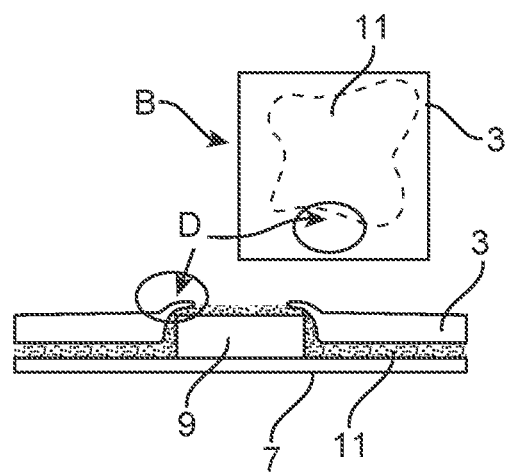
FIG. 5 shows a first embodiment of a proposed method with a proposed device.

FIG. 5 shows an example of a conventional device or meth-od. FIG. 5 shows a light emitting diode structure, wherein a raw LED chip 9 is formed on a substrate 7, which is covered by a spray coating 11. For example, a phosphor spray coating, for example a phosphorus spray coating, has been carried out. For example, by means of TiO2 jetting or TiO2 spraying, a first fluid 3 has been applied, wherein a sur-face area of the LED raw chip 9 facing away from the substrate 7 is to be uncovered by the first fluid 3. Reference sign D indicates areas in which the TiO2 extends into, for example, the light-emitting area of the light-emitting di-ode. In this case, an optoelectronic component B has defective areas D which obstruct the passage of light.

According to FIG. 5, a conventional raw chip attach or die attach was carried out, followed by a spray coating on which a TiO2 jetting was carried out. Subsequently, silicone was cured by means of compression molding on a specific element on which no laser structuring was carried out. The defective areas D have tongues or "flashes" or projections which extend into a light-active area of the LED raw chip 9.

Figure 6:
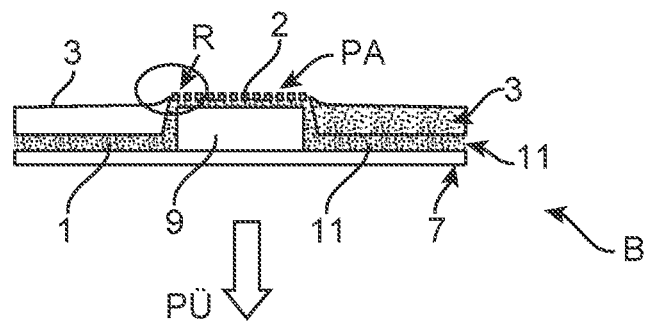
FIG. 6 shows an embodiment of a proposed manufacturing method.

FIG. 6 shows an improved device compared to FIG. 5. The steps die attach, layer attach and film assisted molding are carried out. A raw LED chip 9 is applied to a substrate 7, which is covered by means of a spray coating 11, for example by spray coating a conversion material, in particular a phosphor, for example phosphorus. Once again, a TiO2 layer is to be applied. To improve the device according to FIG. 5, a clear edge region R to the remaining spray coating 11 is now created by means of providing a second surface area 2. The second surface area 2 is microstructured, for example, by means of microstructuring, in particular by means of DLIP (Direct Laser Interference Patterning). In this way, the remaining area of the spray coating 11 is created as a first surface area 1 remaining. The second surface area 2 is the surface area of the LED raw chip 9 facing away from the substrate 7, via which light is transmitted. In this way, a direct edge region R to the remaining spray coating 11 is created. After the spray coating, a so-called "jetting" (spraying) of a corresponding material, which can be TiO2, for example, then takes place. This now provides the first fluid 3, which is to cover a first surface area 1 but is not to wet the second surface area 2. Such an application takes place without additional pressurization, in particular under atmospheric pressure PA or pressure P1. According to a pro-posed device or a proposed manufacturing method of a device, a clearly defined edge or boundary region between the first surface area 1 and the second surface area 2 has now been created for the first fluid 3. Due to the surface properties of the second surface area 2, the second surface area 2 re-mains unwetted by the first fluid 3. In addition, the amount of the first fluid 3 to be applied can be specifically determined and metered in such a way that it is just sufficient for the first surface area 1. As a result, no tongues of the first fluid 3 or of the TiO2 are pushed onto the second surface area 2. Thus, the tongues shown in FIG. 5 are no longer present.

Figure 7:
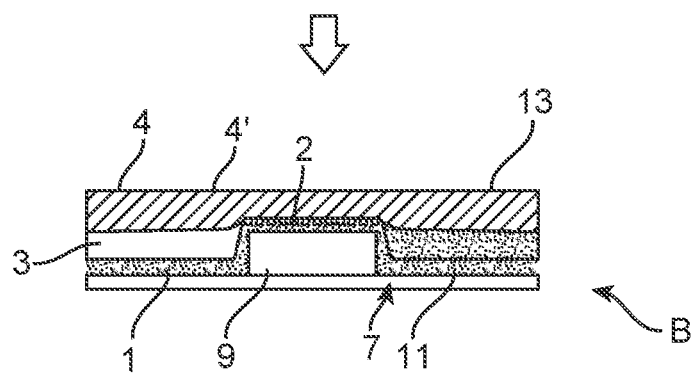
FIG. 7 shows another illustration of a proposed method or a proposed device.

FIG. 7 shows a continuation of a method according to FIG. 6. According to FIG. 7, a further embodiment of an electronic component B is created by applying a second fluid 4 to the second surface area 2 and in the cured first fluid 3 to produce a covering layer 13. The application of the second fluid 4 is performed while removing the non-wettability of the second surface area 2, for example, in a "compression molding" or molding press. Optionally, a sup-porting plasma may be created. In further product variants, the covering layer 13 can in principle also be applied with-out additional compression molding of the covering layer 13.

By means of such a proposed device and by means of such a proposed method, so-called TiO2 tongues can be prevented from entering the optically acting surface area of the LED raw chip 9. In this way, a gain in brightness is producible.

Figure 8:
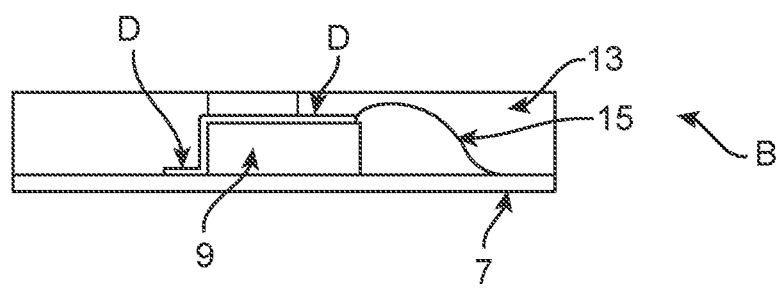
FIG. 8 shows an embodiment of a conventional device.

FIG. 8 shows a further example of a conventional device. According to FIG. 8, a raw chip 9, in particular an LED raw chip, is arranged on a substrate 7. On a light-acting surface side of the raw chip 9, an element is attached by means of an adhesive, which also covers areas of the substrate 7 as well as bonding areas. These defective areas D are marked in FIG. 8. According to FIG. 8, the raw chip 9 is bonded to a contact wire 15 and encapsulated by a covering layer 13. The device according to FIG. 8 was created, for example, by means of the steps "Die-Attach" (DA), "Layer-Attach" (LA) and "Film Assisted Molding" (FAM). Dis-advantageously, the adhesive on the raw chip 9 is addition-ally pressed out onto the substrate 7 and on the bonding surfaces. In this way, a light path of the optoelectronic component B is impaired. Adversely, light absorption occurs in a bonding area and/or in the substrate. The covering layer 13 is produced by means of FAM, for example from TiO2.

Figure 9:
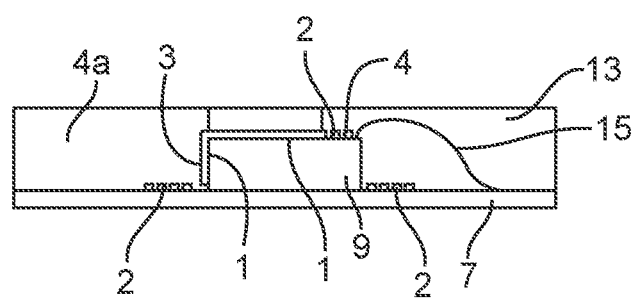
FIG. 9 shows an illustration of a proposed device.

FIG. 9 shows an illustration of an improved device com-pared to FIG. 8. In an advantageous method, second surface areas 2 are provided on the substrate 7 adjacent to a raw chip mounting surface and/or on a main surface of the raw chip 9 facing away from the substrate. In this way, a first surface area 1 is provided as the side surfaces and as the main surface of the raw chip 9 facing away from the substrate. In a further process step, a first fluid 3 created as a layered adhesive is applied to the first surface areas 1 without applying additional pressure, wherein the first surface areas 1 are wetted and the second surface 2 remains unwetted. In this way, leakage of an adhesive can be con-trolled and in this way, subsequent optical losses can be avoided. In this way a brightness gain can be provided. Ac-cording to FIG. 9, a raw LED chip 9 with locally de-wetting surface areas 2 can be provided. In addition to un-covered substrate areas, pure bonding areas can also be left uncovered, for example on the raw chip 9. On these small bonding areas (bond pads), contact wires 15 can be electrically connected by means of a solder, as an example of a second fluid 4. Finally, a further second fluid 4a can be applied by means of FAM under high pressure PÜ or P2 in such a way that a covering layer 13 is formed which finally cures. According to the device and the method shown in FIG. 9, optical losses caused by an interfering adhesive can be avoided. Furthermore, reflective material can be prevented from covering bond pads. It can also be avoided that adhesive runs onto a substrate 7 on the left and right side of a raw chip 9 in FIG. 9. By means of bonding, in particular with additional application of FAM, a layer comprising silicone and TiO2, for example, can also be applied under high pressure to the surface-structured areas and the two second surface areas 2, respectively.

According to FIG. 9, a lotus blossom effect can be used to set light-absorbing chip and substrate areas for a layered adhesive. Controlled wetting is achieved by means of an adhesive layer on a bond pad area or on a substrate. Second surface areas 2 enable dewetting or a stop function. No "floating layers" result, since an adhesive distribution can be specifically controlled. Wire bonding under pressure is then possible on the microstructured second surface areas 2, whereby the second fluid 4 can then be a solder. Thereafter, there is an additionally increased adhesive force during wire bonding as a result of a surface enlargement by means of a micromechanical anchoring. The lotus blossom effect can be cancelled for the second surface areas 2 in a TiO2 application under high pressure PÜ in a FAM process.

Figure 10:
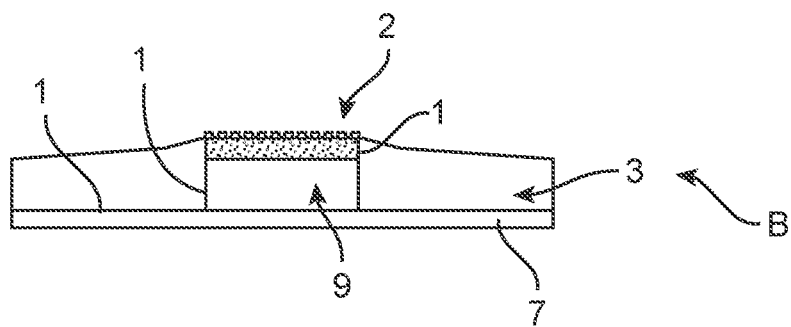
FIG. 10 shows another embodiment of a proposed device.

FIG. 10 shows a further example of a proposed device. FIG. 10 shows a raw chip 9 arranged on a substrate 7, on whose surface facing away from the substrate 7 a silicone layer has been applied. Conventionally, the disadvantage is that the applied silicone layer has an insufficient stopping effect in contrast to ceramic layers for TiO2 encapsulation.

According to further embodiments, the surface of the silicone layer can be microstructured in such a way that, in contrast to a first wettable surface area 1, a second sur-face area 2 is created which repels or allows a first fluid 3 to bead off. Thus, the silicone layer in the second sur-face area 2 is set to be wettable for, for example, a TiO2 encapsulation. For the manufacture of a corresponding optoelectronic component B, the cancellation of a so-called lotus blossom effect is not necessary. However, a film-assisted molding (FAM) can be carried out by means of a compression molding step or in the case of strong under-casting. In a device according to FIG. 10, tongues of the first fluid 3 penetrating into the second surface area 2 can be effectively avoided. This can be achieved by structuring the silicone layer over a large area. The TiO2 material remains on a top edge. The silicone layer can be bonded and surface-structured in a simple manner. In this way, a TiO2 undercast up to a defined line is made possible for silicone layers, which was conventionally only possible when creating ceramic layers with sharp edges. In this way, a gain in brightness can be achieved. In addition, new design options arise. By providing the silicone layer with a dewetting surface to avoid tongues or "flash", respectively, a TiO2 cast can be performed in a simple way.

Figure 11:
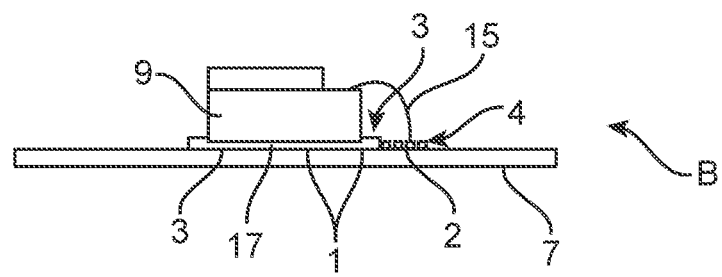
FIG. 11 shows another embodiment of a proposed device.

FIG. 11 shows another example of a proposed device. A raw chip 9 is attached on a substrate 1 by means of an adhesive layer. In order to hold the adhesive in the area of a raw chip mounting surface 17, a second surface area 2 has been created in a bond pad area. This stops the adhesive applied to the first surface area 1 as the first fluid 3 in the direction toward the bond pad. By means of a solder as the second fluid 4, a contact wire 15 can be pressed onto the second surface area 2 under high pressure PÜ and thus be contacted. In the first surface area 1 on the surface of the substrate 7, the adhesive has also been applied as the first fluid 3.

According to this proposed embodiment, wetting by a die at-tach adhesive on subsequent bonding areas can be avoided. The lotus blossom effect or the non-wettability in the second surface area 2 can be eliminated by wire bonding under high pressure. This results in better adhesion of a wire bond, since there is no adhesive contamination and there is also a micromechanical anchoring for the solder. FIG. 11 shows an embodiment for a general manufacture of dewetting surface areas 2, in particular on light emitting diode pack-ages. For example, top surfaces of cavity housings can be micro- and/or nanostructured to prevent overflow of, for ex-ample, a silver conductive adhesive. According to FIG. 11, the substrate 7 may have been pre-treated. According to FIG. 11, pressure holding can be performed until, for example, the adhesive material or the bonding material hardens. Microstructuring can be carried out especially when very high pressure can be applied. According to the embodiment shown in FIG. 11, this results in increased robustness for wire bond connections. FIG. 11 shows a substrate 7 with a dewetting area created as a second surface area 2. This can also be used for wire bonding under high pressure PÜ.

Figure 12:
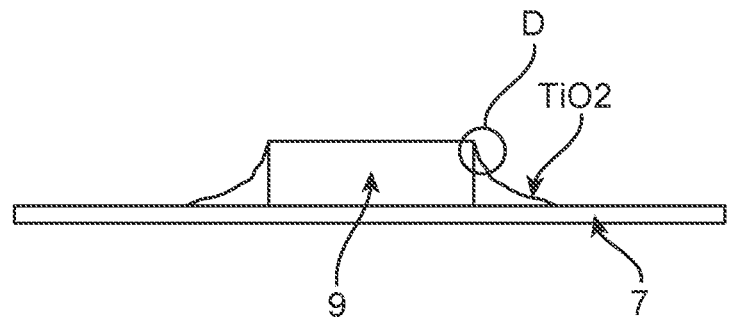
FIG. 12 shows another embodiment of a conventional device.

FIG. 12 shows an illustration of a conventional device. A raw chip 9 is applied to a substrate 7. Here, the raw chip 9 is a volume emitter. It has reflector material on the left and right. Disadvantageously, a small thickness of the reflector material results on an upper side, which is marked as defective region D. The reflector material here is for example TiO2. In this way, a brightness of the volume emitter is impaired.

Figure 13:
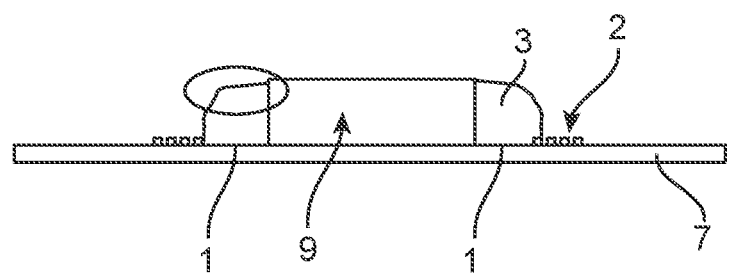
FIG. 13 shows another embodiment of a proposed device.

FIG. 13 shows an improvement of the device according to FIG. 12. According to FIG. 13, the shaping of the reflector material, here in the case of volume emitters, can be improved by means of weeding areas or by providing a second surface area 2 as opposed to a first surface area 1.

According to FIG. 13, second surface areas 2 of the side of the substrate 7 facing the volume emitter are provided at a distance from the volume emitter or from the raw chip 9. As a result, two first surface areas 1 are simultaneously created between the volume emitter and the generated second surface areas 2 on the left and right of the volume emitter. If a metered amount of reflector material is now applied to the first surface areas 1 on the left and right of the volume emitter as the first fluid 3, a stronger reflector thickness can now be formed on the upper side of the volume emitter. Due to the stopping effect caused by the second surface area 2 provided in a wetting manner, a modified "meniscus" of the reflector material can be created in the cross-section shown. It changes in the illustrated cross-section the surface course of the reflector thickness from concave to convex, since a thicker reflector thickness can be created at the upper side of the volume emitter compared to the prior art. In principle, the boundary lines between the first surface area 1 and the second surface area 2 can be varied in such a way that alternative advantageous sur-face gradients can be provided. Due to the thicker reflector material above, an increased brightness can be generated. Shaping of the reflector material in the case of volume emitters can be provided in a targeted manner.

Further advantageous embodiments result from a general manufacture of dewetting areas on light-emitting diode packages, whereby, for example, tops of cavity housings can be provided in a dewetting manner in order to avoid overflow. This results in increased process stability. Overflow during volume casting can be avoided. If necessary, greater stability can also be achieved in the case of metered lenses or over-casting, since leakage is prevented. This can also result in lower color location scattering. In this way, package sur-faces with dewetting properties can be advantageously provided, for example a top surface to avoid tongues or "flash" in volume casting.

According to another embodiment, the transition area between the second surface area 2 and the first surface area 1 can be used as a stick edge. For example, metered lenses in the form of silicone drops can be created. For this purpose, ring-shaped structuring can be created, for example. For ex-ample, protection of electrical contact areas can be provided. This results in new design options as well as increased process stability.

According to a further embodiment, a reduction of a stickiness of surfaces can be created. Similarly, dirt-repellent surfaces can be provided. This can be used for processing such as during sawing or singulation or in subsequent applications.

According to a further embodiment, an improvement in adhesion of mold compound to substrate or of wire bond connections can be created when the lotus blossom effect is eliminated. This can be used to provide generally better adhesion as well as reduced risk of delamination.

For example, a direct laser interference patterning (DLIP) system can be used to create second surface areas (not shown). Such a system can produce a desired micrometer or submicrometer pattern on a large surface area.

Different lasers can be integrated into the DLIP system so that high process speeds, flexible structural geometries and/or the processing of 3D components are possible.

In an exemplary DLIP process, two laser beams are superimposed. By superimposing the laser beams, a structure size in the micrometer or submicrometer range can be set. In addition, the superposition results in an interference pattern depth in the millimeter to centimeter range. The superposition of both laser beams defines a superposition volume or interference volume. The structure size is determined by the width of the transition area to the surface area to be pro-cessed.

For example, a periodic hexagonally oriented structure can be generated on polyethylene (PET) or a periodic line structure on stainless steel (not shown).

Figure 14:
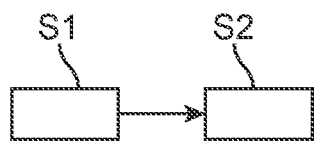
FIG. 14 shows an embodiment of a proposed manufacturing method.

FIG. 14 shows an example of a method according to embodiments of the invention. According to a first step S1, a second surface area of the component adjacent to a first surface area is provided, the second surface area being made repulsive for a first fluid to be applied. In a second step S2, the first fluid is applied, in particular a metered amount, to the first and/or second surface area, in particular only to the first surface area, without applying additional pressure, the first sur-face area being wetted by the first fluid and the first flu-id being rejected by the second surface area in such a way that the latter remains uncovered.

Although the invention has been illustrated and described in detail by means of the preferred embodiment examples, the present invention is not restricted by the disclosed examples and other variations may be derived by the skilled person without exceeding the scope of protection of the invention.

The invention claimed is:

1. A device comprising:
a first surface area;
a second surface area located adjacent to the first surface area,
wherein the second surface area is configured to be repellent to a first fluid,
wherein the first surface area is wetted by the first fluid and the second surface area is uncovered by the first fluid;
a raw chip attached to a substrate;
a spray coating applied to the raw chip and to the substrate on its side facing the raw chip; and
a covering layer,
wherein a main spray-coated surface of the raw chip facing away from the substrate is the second surface area,
wherein a remainder of the spray coating with its side facing away from the substrate is the first surface area,
wherein the first fluid becomes the covering layer, and
wherein the first surface area was wetted and the second surface area remains unwetted.

2. The device according to claim 1, wherein the second surface area is an exit side of a cavity housing.

3. The device according to claim 1, wherein, after solidification of the first fluid applied to the first surface area, a second fluid is applied to the second surface area and to a surface area of the solidified first fluid by additional pressurization.

4. A device comprising:
a first surface area;
a second surface area located adjacent to the first surface area,
wherein the second surface area is configured to be repellent to a first fluid,
wherein the first surface area is wetted by the first fluid and the second surface area is uncovered by the first fluid; and
a raw chip attached to a substrate,
wherein the substrate adjacent to a raw chip mounting surface and a first portion of a main surface of the raw chip facing away from the substrate form the second surface area,
wherein side surfaces of the raw chip and at least a second portion of the main surface of the raw chip facing away from the substrate form the first surface area,
wherein the first fluid is applied to the first surface area without additional pressurization and forms a layered adhesive, and
wherein the first surface area has been wetted and the second surface area remains unwetted.

5. The device according to claim 4, wherein the second surface area provided at the main surface of the raw chip facing away from the substrate is a contact surface for a wire bonding with a second fluid being a solder for a wire connection.

6. The device according to claim 4, further comprising a third fluid becoming a covering layer.

7. A device comprising:
a first surface area;
a second surface area located adjacent to the first surface area,
wherein the second surface area is configured to be repellent to a first fluid, wherein the first surface area is wetted by the first fluid and the second surface area is uncovered by the first fluid;

a raw chip attached to a substrate; and a silicone layer located at the raw chip on a main surface of the raw chip facing away from the substrate, wherein a surface of the silicone layer facing away from the substrate is the second surface area, wherein a side surface of the silicone layer, a side surface of the raw chip and a side of the substrate facing the raw chip form the first surface area, wherein the first fluid is applied to the first surface area as an encapsulation, and wherein the first surface area is wetted and the second surface area remains unwetted.

8. The device according to claim 7, wherein the second surface area is an exit side of a cavity housing.

9. A device comprising:

a first surface area; and a second surface area located adjacent to the first surface area, wherein the second surface area is configured to be repellent to a first fluid, wherein the first surface area is wetted by the first fluid and the second surface area is uncovered by the first fluid, wherein a substrate having a common line of contact with a raw chip mounting surface forms the second surface area, wherein the remaining substrate on a side of the raw chip mounting surface forms the first surface area, wherein the first fluid having been applied to the first surface area without additional pressurization forms a layered adhesive, wherein the first surface area was wetted and the second surface area remains unwetted, and wherein a raw chip is attached to the layered adhesive on the first surface area at the raw chip mounting surface.

10. The device according to claim 9, wherein a second fluid becomes an adhesive or a solder, the second fluid having been applied to the second surface area by an additional pressurization.

11. A device comprising:

a first surface area;

a second surface area located adjacent to the first surface area, wherein the second surface area is configured to be repellent to a first fluid, wherein the first surface area is wetted by the first fluid and the second surface area is uncovered by the first fluid; and a volume emitter arranged on a substrate, wherein the first surface area includes an area adjacent to the volume emitter on a side of the substrate facing the volume emitter, wherein the second surface area includes an area at a distance from the volume emitter on the side of the substrate facing the volume emitter, wherein the first fluid is a reflector material applied to the first surface areas without additional pressurization, and wherein the first surface area was wetted and the second surface area remains unwetted.

12. The device according to claim 11, wherein the reflector material is applied with a constant thickness between the volume emitter and the second surface area.

* * * * *